United States Patent
Horstkotte et al.

(12)

(10) Patent No.: US 6,188,321 B1
(45) Date of Patent: Feb. 13, 2001

(54) MONITORING CIRCUIT FOR A SUPPLY VOLTAGE

(75) Inventors: Rainer Horstkotte, Seligenstadt; Thomas Bierwirth, Büdingen, both of (DE)

(73) Assignee: Schneider Automation GmbH, Seligenstadt (DE)

(*) Notice: Under 35 U.S.C. 154(b), the term of this patent shall be extended for 0 days.

(21) Appl. No.: 09/063,731

(22) Filed: Apr. 24, 1998

(30) Foreign Application Priority Data

Apr. 26, 1997 (DE) ............................................. 197 17 811

(51) Int. Cl.[7] ................................................. G08B 21/00
(52) U.S. Cl. ...................... 340/660; 340/511; 340/635; 340/664; 361/30
(58) Field of Search ................................. 340/660, 636, 340/661, 663, 664, 665, 635, 642, 506, 511, 537; 361/118, 119, 30; 364/138, 188

(56) References Cited

U.S. PATENT DOCUMENTS

| | | | |
|---|---|---|---|
| 3,852,732 | * 12/1974 | Yorksie et al. | 340/636 |
| 4,234,920 | 11/1980 | Van Ness et al. | 714/22 |
| 4,262,283 | * 4/1981 | Chamberlain et al. | 340/533 |
| 4,605,922 | * 8/1986 | Blattman et al. | 340/552 |
| 4,833,450 | * 5/1989 | Buccola et al. | 340/506 |
| 5,304,986 | * 4/1994 | Motegi | 340/636 |

FOREIGN PATENT DOCUMENTS

| | | |
|---|---|---|
| 3910212 | 10/1990 | (DE) . |
| 19532677 | 6/1997 | (DE) . |
| 0623868 | 11/1994 | (EP) . |

* cited by examiner

Primary Examiner—Edward Lefkowitz
Assistant Examiner—Davetta W. Goins
(74) Attorney, Agent, or Firm—Dennison, Scheiner, Schultz & Wakeman

(57) ABSTRACT

The invention relates to a monitoring circuit for at least one supply voltage (UB, UH), including a first threshold switch (20), which if the supply voltage (UB) drops below a predeterminable threshold value generates a first warning signal (USWN), and a second threshold switch (66), which after a fixed warning period tw elapses generates a second warning signal (TOTUSN). In order that the warning signals will be generated without bounce, it is provided that the threshold switches (20, 66) each have an internal counting circuit for determining time periods tv1, tv2, after which the first and second warning signals (USWN, TOTUSN) generated are reset.

16 Claims, 2 Drawing Sheets

MONITORING CIRCUIT FOR A SUPPLY VOLTAGE

BACKGROUND OF THE INVENTION

The invention relates to a monitoring circuit for at least one supply voltage, including a first threshold switch, which if the supply voltage drops below a predeterminable threshold value generates a first warning signal USWN, and a second threshold switch, which after a fixed warning period tw elapses generates a second warning signal TOTUSN.

Such a monitoring circuit is known (German Patent 39 10 212 C2). In this monitoring circuit, the first and second warning signals and a signal from the monitoring circuit, which responds if the supply voltage drops below a predetermined lower threshold, put switch elements in a switching state in which terminals for the warning signals are disconnected from the pole furnishing the supply voltage at a high voltage level and are connected to the other pole that furnishes the low supply voltage. This assures that the first and second warning signals have the requisite level for reliable detection even if the supply voltage, for a relatively long period of time, is at a level which while somewhat high is still not adequate for operating a data processor.

OBJECT OF THE INVENTION

The object of the invention is to furnish a monitoring circuit for a supply voltage with which the warning signal and the alarm signal can be generated bounce free and secure against zero voltage in the event of a malfunction and can be reset again upon resumption of voltage, all at little effort and expense. An embodiment of the circuit with SMD components should also be possible.

In a monitoring circuit of the type described at the outset, this object is attained according to the invention in that the threshold switches each have an internal counting circuit for determining time periods tv1, tv2, after which the first and second warning signals (USWN, TOTUSN) generated are reset again. Because the warning signals are kept at a defined binary value, such as "LOW", for a defined period the signal that generates the warning signals is debounced. The threshold switches used, because of their internal counting circuit, require no external circuitry for determining the delay times tv1, tv2, and as a result on the one hand fewer components are needed and on the other an embodiment with SMD technology is made possible.

In a preferred embodiment, the monitoring circuit, for monitoring an auxiliary voltage, has a third threshold switch, which if the auxiliary voltage drops below a predeterminable threshold value sets the first and second warning signals USWN and TOTUSN to the binary value "LOW". This provision assures zero-voltage security. The term "secure against zero voltage" means that the signals remain at a safe level, such as zero volts, regardless of the other levels present in the monitoring circuit, and for example even in the event of low voltage.

It can be noted as a particular advantage of the monitoring circuit that the threshold switches are all of the same construction and are preferably of the type known as MAX809. As a result, an especially simple, economical circuit design using SMD technology can be achieved. The threshold value levels can be set to different values.

It is provided that the first threshold switch is followed by a capacitor which is discharged as a reaction to the first warning signal USWN and is recharged as a reaction to the second warning signal TOTUSN. On the one hand, the capacitor is connected by its positive terminal, via a resistor and a transistor, to a positive pole of the supply voltage or auxiliary voltage, and on the other hand by its negative terminal to a negative pole of the supply voltage or auxiliary voltage; the base of the transistor is connected, via a resistor and a driver member, to the output of the first threshold switch, and via a further resistor and a driver member to the output of the second threshold switch. As a result of this circuitry provision it is attained that the capacitor is recharged immediately after the tripping of the second warning signal TOTUSN, so that even voltage dips occurring in rapid chronological succession can be detected.

A resistor is connected parallel to the capacitor, for discharging it. The warning period tw can be adjusted via the value of the parallel-connected resistor.

In a further preferred embodiment it is provided that the capacitor is connected by its positive terminal, via a resistor and a diode, to a driver component, whose output is controllable as a function of the voltage of a primary capacitor. With long warning times tw, it is not suitable to design the storage capacitor for the input voltage (primary capacitor) for maximum tolerance in terms of the warning time tw. By means of the proposed circuits, it is now possible to discharge the capacitor early, as a function of the voltage at the primary capacitor. This shortens the warning time tw.

It is also provided that the voltage of the primary capacitor is delivered to the base of an optocoupler, whose collector is connected to the positive pole of the supply voltage or auxiliary voltage and whose emitter is connected to the center tap of a voltage divider located between the positive and negative poles of the supply voltage or auxiliary voltage, and one input of the driver component is also connected to the center tap of the voltage divider. The first threshold switch is also triggerable via an optotransistor. By means of the optotransistors, a galvanic decoupling is assured.

Further details, advantages and characteristics of the invention will become apparent not only from the claims and the characteristics recited in them—taken independently and/or in combination—but also from the ensuing description of a preferred exemplary embodiment shown in the drawings.

DETAILED DESCRIPTION OF THE INVENTION

Figure 1:
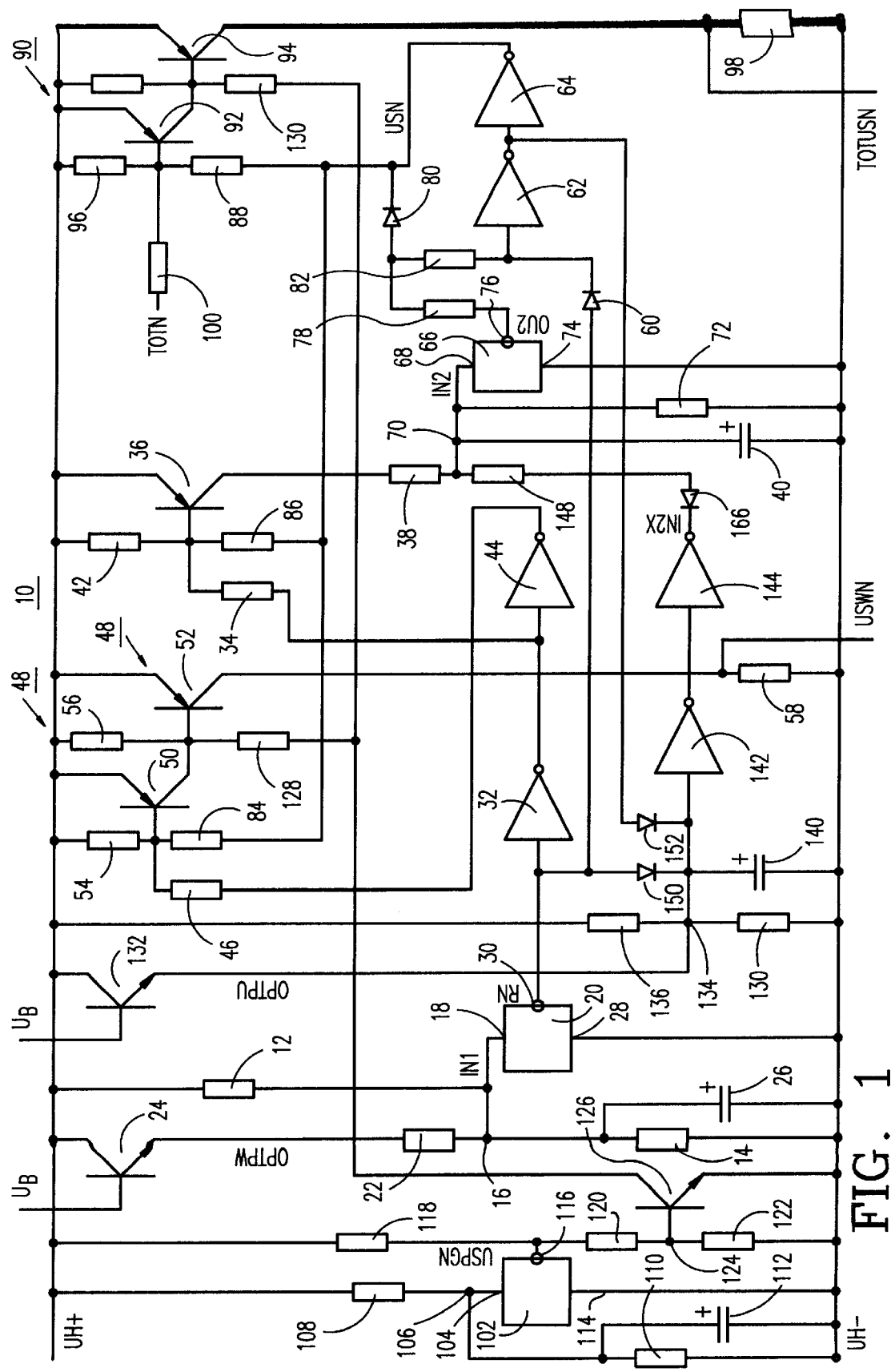
FIG. 1, a basic circuit diagram of a circuit for monitoring supply voltages.

FIG. 1 shows a basic circuit diagram for a monitoring circuit 10 for a supply voltage UB. The monitoring circuit 10 includes an auxiliary voltage source UH having the poles UH+ and UH−, of which the pole UH− is connected to ground. Disposed between the poles UH+ and UH− is a voltage divider, formed by the resistors 12 and 14. A center tap 16 of the voltage divider, to which the signal IN1 is applied, is connected to one input 18 of a first threshold switch 20. Disposed parallel to the resistor 12 is a series circuit comprising a resistor 22 and a transistor 24, whose collector is connected to the pole UH+ and whose emitter is connected to the resistor 22. The transistor 24 is preferably an optotransistor, at whose base the supply voltage or primary voltage to be monitored is applied. A capacitor 26 is disposed parallel to the resistor 14. The threshold switch 20 is connected to the pole UH− via a further terminal 28.

An output 30 of the threshold switch 20, at which the signal RN is present, is connected to the input of an inverting driver 32. The output of the driver 32, via a resistor 34, is connected to the base of a transistor 36, whose emitter is connected to the pole UH+ and whose collector, via a resistor 38, is connected to the positive terminal of a capacitor 40 whose negative terminal is connected to the pole UH–. A resistor 42 is connected parallel to the base-to-emitter path of the transistor 36.

The driver 32 is followed by a further inverting driver component 44, whose output is connected via a resistor 46 to an output stage 48, which generates a signal USWN. The output stage 48 comprises the two transistors 50 and 52, which are each connected by their emitters to the pole UH+. The base of the transistor 50 is connected to the resistor 46. A resistor 54 is connected parallel to the base-to-emitter path of the transistor 50. The collector of the transistor 50 is connected to the base of the transistor 52, and a resistor 56 is connected parallel to the base-to-emitter path of the transistor 52. The collector of the transistor 52, at which the first warning signal USWN can be picked up, is connected to the pole UH– via a resistor 58.

The output 30 of the first threshold switch 20 is also connected via a diode 60 to the input of an inverting driver component 62. The driver 62 is followed by a further inverting driver 64 for forming a signal USN.

A second threshold switch 66 is connected by its input 68 to a junction 70 between the resistor 38 and the positive terminal of the capacitor 40. Disposed parallel to the capacitor 40 is a resistor 72, by way of which the capacitor can be discharged. The signal IN2 is applied to the input 68 of the threshold switch 66. The threshold switch 66 is also connected to the pole UH– via a terminal 74. An output 76 of the threshold switch 66, at which the signal OU2 is present, is connected via a resistor 78 to the anode of a diode 80, at whose cathode the signal USN can be picked up. The anode of the diode 80 is also connected via a resistor 82 to the input of the inverting driver component 62.

The output of the inverting driver 64 is connected to the cathode of the diode 80 and is applied via a resistor 84 to the base of the transistor 50, so that the warning signal USWN can be formed via the output stage 48. The signal USN is applied via a resistor 86 to the base of the transistor 36, in order to vary the signal IN2. The signal USN is also applied via a resistor 88 to an output stage 90, which generates the second warning signal TOTUSN.

The output stage 90 comprises a first transistor 92, whose base is connected to the resistor 88. The emitter of the transistor 92 is connected to the pole UH+, and the collector of the transistor 92 is connected to the base of a second transistor 94. A resistor 96 is connected parallel to the base-to-emitter path of the transistor 92. The emitter of the transistor 94 is connected to the pole UH+, and the collector of the transistor 94 is connected via a resistor 98 to the pole UH–. The second warning signal TOTUSN can be picked up at the collector of the transistor 94. The base of the transistor 92 can also be acted upon by the signal TOTN via a resistor 100.

To improve the zero-voltage security, the monitoring circuit 10 has a third threshold switch 102, whose input 104 is disposed at a pickup 106 of a voltage divider, which is formed by the resistors 108 and 110 and is disposed between the poles UH+ and UH–. A capacitor 112 is disposed parallel to the resistor 110. The threshold switch 102 is also connected by one terminal 114 to the pole UH–.

An output 116 of the threshold switch 102 at which a signal USPGN is present is connected to the pole UH+ via a resistor 118. The output 116 is connected to the pole UH–, by a voltage divider comprising the resistors 120 and 122. A pickup 124 of the voltage divider is connected to the base of the transistor 126. The emitter of the transistor 126 is connected to UH–, while the collector of the transistor 126 is connected on the one hand to the base of the transistor 52 via the resistor 128 and on the other to the base of the transistor 94 via a resistor 130. The threshold switch 102 serves to monitor the auxiliary voltage UH. If a certain level, such as 4.4 V, fails to be attained at the input 104 of the threshold switch 102, then the output 116 of this threshold switch switches the signal USPGN to the binary value "LOW". The transistor 126 blocks the output stages 48 and 90, and as a result both warning signals USWN and TOTUSN are switched to the binary value "LOW". This guarantees the zero-voltage security.

A second optotransistor 132 is also provided, whose collector is connected to the pole UH+ and whose emitter is connected to a pickup 134 of a voltage divider, which comprises the resistors 136 and 138 and is located between the poles UH+ and UH–. Parallel to the resistor 138, there is a capacitor 140. The pickup 134 is connected to the input of an inverting driver component 142, which is followed by a further inverting driver component 144 to whose output the signal IN2X is applied. The output of the driver component 144 is connected to the cathode of a diode 166, whose anode, via a resistor 148, is connected to the positive terminal of the capacitor 40. The output 30 of the first threshold switch 20 is also connected via a diode 150 to the input of the driver 142, and the output of the driver 62 is connected via a diode 152 to the input of the driver 142.

Figure 2:
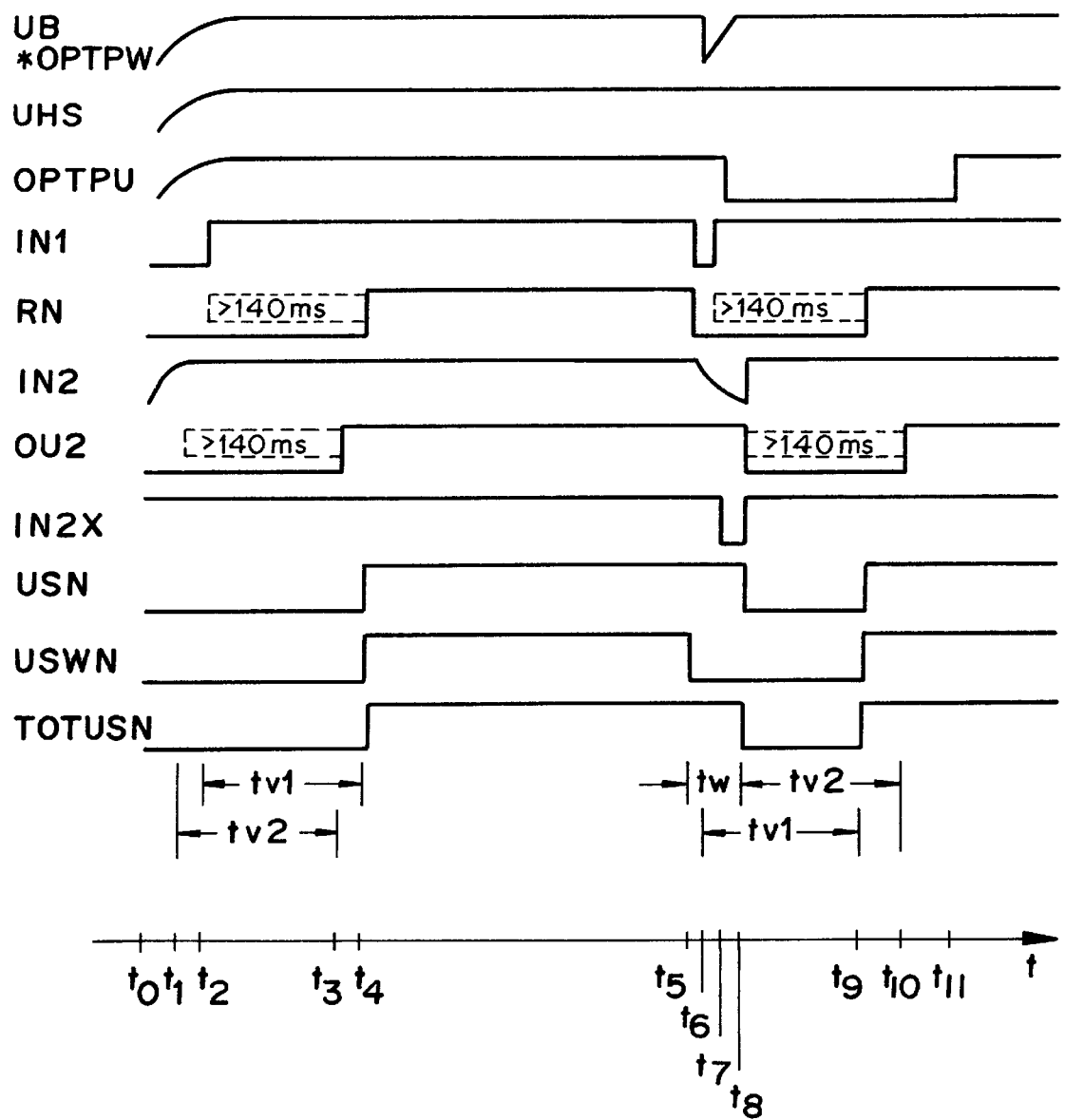
FIG. 2, a timing diagram of signals in the arrangement of FIG. 1.

The function of the monitoring circuit will now be described, in terms of the timing diagram shown in FIG. 2.

The threshold switches 20, 66, 102 used in the circuit switch to the binary value "LOW", if a voltage applied to the input drops below a threshold voltage, and they hold the binary value "LOW" if the voltage applied to the input is below a threshold voltage for a defined period of time, such as 140 ms.

At time $t_0$, on the one hand the supply voltage UB (signal OPPW) and on the other the auxiliary voltage UH are turned on. As a consequence of the capacitances included in the circuit, the signals OPTPW, UH and OPTPU exhibit an exponential rise. The transistor 36 is switched through at this moment, so that the capacitor 40 is charged, and as a result the signal IN2 likewise has an ascending course.

At time $t_1$, the signal IN2 at the input 68 of the threshold switch 66 exceeds a predefined threshold voltage, so that this threshold switch remains at the binary value "LOW" for a further defined period of time tv2 of approximately 140 ms.

At time $t_2$, the supply voltage attains a value at which the optotransistor 24 switches through, so that the input signal IN1 of the first threshold switch 20 switches to the binary value "HIGH". As a result, the set threshold voltage at the input 18 of the threshold switch 20 is exceeded, causing this switch to remain at the binary value "LOW" still for a defined period of time tv1, for instance 140 ms.

The time periods tv1 and tv2 of the threshold switches 20, 26 serve to debounce the input signals IN1, IN2. This means that for a certain minimum duration, the signals remain at a certain level.

It can be noted as a particular advantage of the present circuit that the threshold switches 20, 66, 102 have an internal counting circuit, with which the delay periods tv1, tv2 are determined. External wiring with capacitors for determining these delay times is dispensed with, thus making it possible to construct the circuit arrangement using SMD technology.

After the delay time tv2 elapses, that is, at time $t_3$, the output 76 of the threshold switch 66 switches the signal OU2 to the binary value "HIGH". USN remains at LOW (selfholding via 80). After the delay period tv1 elapses, that is, at time $t_4$, the signal RN at the output 30 of the threshold switch 20 switches from the binary value "LOW" to the binary value "high". Via the driver components 32, 44, the output stage 48 is activated, so that the first warning signal USWN switches from the binary value "LOW" to the binary value "HIGH". Via the diode 60, the self-holding of the signal USN is cancelled. Because of the change in level of the signal USN, the output stage 90 switches the second warning signal TOTUSN from the binary value "LOW" to the binary value "HIGH", on the precondition that the signal TOTN at the resistor 100 has the binary value "HIGH".

After the delay times tv1, tv2 have elapsed, the monitoring circuit is in its operating state. If the primary voltage picked up at a primary capacitor undershoots a certain value (time $t_5$), then the transistor 24 switches to the nonconducting state, and as a result the signal IN1 at the input 18 of the threshold switch 20 switches from the binary value "HIGH" to the binary value "LOW". The threshold voltage at the input of the threshold switch 20 is undershot, and thus the output signal RN is switched to the binary value "LOW" as well. If the primary voltage rises again, the signal at the base of the transistor 24 soon resumes a value at which the transistor 24 switches to the conducting state. As a consequence, also after a short time (time $t_6$), the input signal IN1 switches back from the binary value "LOW" to the binary value "HIGH". Depending on the function of the threshold switch, this switch remains at the binary value "LOW" if the threshold voltage is exceeded for the defined time tv1.

Via the inverting drivers 32 and 34 that follow the output 30 of the threshold switch 20, the output stage 48 is triggered for generating the first warning signal USWN, which is switched to the binary value "LOW". In addition, via the inverting driver 32 and the resistor 34, the transistor 36 is switched to the nonconducting state. As a result, the capacitor 40 discharges via the resistor 72, so that the signal IN2 assumes an exponentially dropping course. After a time tw (warning time), that is, at time $t_8$, the signal IN2 undershoots a threshold value of the threshold switch 66, so that the signal OU2 at the output 76 of the threshold switch 66 is switched to the binary value "LOW". Correspondingly, the signal USN also switches from the binary value "HIGH" to the binary value "LOW".

The signal USN is delivered via the resistor 88 to the output stage 90, and as a result the output signal TOTUSN is switched to the binary value "LOW". The signal USN is also delivered to the base of the transistor 36 via the resistor 86. If the signal USN is at the binary value "LOW", then the transistor 36 is switched through, which causes an immediate recharging of the capacitor 40. This has the advantage that even voltage dips that occur in rapid chronological succession can be detected. As a consequence of the rise in the signals IN2, the level at the input 68 of the threshold switch 66 exceeds the threshold voltage, so that the signal OU2 at the output 76 remains at the binary value "LOW" for a defined time tv2. As a result, it is assured that the signal IN2 is debounced.

Once the delay time tv1 of the first threshold switch 20 elapses, that is, at time $t_9$, this switch switches the output signal RN from the binary value "LOW" to the binary value "HIGH". The change in level of the signal RN is carried, via the inverting drivers 32 and 34 and the resistor 46, to the output stage 48, so that the first warning signal USWN switches from the binary value "LOW" to the binary value "HIGH". The signal RN is also carried via the diode 60 as well as the inverting drivers 62, 64 and the resistor 88 to the output stage 90, so that the second warning signal TOTUSN switches from the binary value "LOW" to the binary value "HIGH". Finally, after the delay time tv2, that is, at time $t_{10}$, the signal OU2 switches to the binary value "HIGH".

If the warning times threshold switch are long, it is not useful to design the storage capacitor for the input voltage for the maximum tolerance in terms of the warning time. The voltage of the storage capacitor is therefore picked up and delivered to the base of the optotransistor 132. If the voltage of the storage capacitor undershoots a certain value, then the signal OPTPU switches from the binary value "HIGH" to the binary value "LOW", which in the pulse diagram shown occurs at time $t_7$. As a result of the level change at the input of the inverting drivers 142, 144, the signal IN2X also changes its level and switches from the binary value "HIGH" to the binary value "LOW". As a consequence, the capacitor 40 can discharge early, via the resistor 148 and the diode 166. This shortens the warning time tw. By means of this circuitry provision, it is possible to use a smaller capacitor on the primary side.

A special feature of the monitoring circuit that should be mentioned is the monitoring of the auxiliary voltage UH by the threshold switch 102. If the auxiliary voltage UH is undershot below a certain level, such as 4.4 V, then the output signal USPGN of the threshold switch 102 switches to the binary value "LOW". The following transistor 126 blocks, so that the output stages 48, 90 triggered by the transistor 126 are blocked as well. The output signal USWN and TOTUSN switch to the binary value "LOW", thus guaranteeing the zero-voltage security even if a plurality of power supply units are used.

What is claimed is:

1. A monitoring circuit (10) for at least one supply voltage (UB), comprising: a first threshold switch means (20), which generates a first warning signal (USWN) when the supply voltage (UB) drops below a first predetermined threshold value; a second threshold switch means (66), which generates a second warning signal (TOTUSN) after a fixed warning period tw has elapsed; each of the threshold switch means (20, 66) include an internal counting circuit for determining first and second time periods tv1, tv2; said first and said second generated warning signal (USWN, TOTUSN) is reset at the end of said first and second time periods.

2. The monitoring circuit of claim 1, further including third threshold switch means (102) for monitoring an auxiliary voltage (UH), said third threshold switch means sets the first and second warning signals (USWN and TOTUSN) to the binary value "LOW" when the auxiliary voltage drops below a second predetermined threshold value.

3. The monitoring circuit of claim 2, wherein the threshold switch means (20, 66, 102) are of the same construction.

4. The monitoring circuit of claim 1, wherein the first threshold switch (20) is followed by a capacitor (40), which is discharged as a reaction to the first warning signal (USWN) and is recharged as a reaction to the second warning signal (TOTUSN).

5. The monitoring circuit of claim 4, wherein the capacitor (40) is connected by its positive terminal, via a resistor (38) and a transistor (36), to a positive pole of the auxiliary voltage (UH), and by its negative terminal to a negative pole of the auxiliary voltage (UH).

6. The monitoring circuit of claim 1, wherein the capacitor (40) is connected by its positive terminal to the input (68) of the threshold switch (66).

7. The monitoring circuit of claim 5, wherein the base of the transistor (36) is connected, via a resistor (34) and an inverting driver (32), to the output (30) of the first threshold switch (20).

8. The monitoring circuit of claim 5, wherein the base of the transistor (36) is connected, via a resistor (86) and an inverting driver (62, 64), via a resistor (78, 82) to the output (76) of the second threshold switch (66).

9. The monitoring circuit of claim 4, wherein a resistor (72) is connected parallel to the capacitor (40) for discharging it.

10. The monitoring circuit of claim 4, wherein the capacitor (40) is connected by its positive terminal, via a resistor (148) and a diode (166), to a driver component (144), whose output is controllable as a function of the voltage (UB) of a primary capacitor.

11. The monitoring circuit of claim 1, wherein the supply voltage (UB) is delivered to the base of an optocoupler (132), whose collector is connected to the positive pole of the supply voltage or auxiliary voltage and whose emitter is connected to the center tap of a voltage divider located between the positive and negative poles of the supply voltage or auxiliary voltage, and one input of the driver component (142) is also connected to the center tap (134) of the voltage divider.

12. The monitoring circuit of claim 11, wherein the output (30) of the first threshold switch (20) is connected via a diode (50) to the input of the driver component (142).

13. The monitoring circuit of claim 11, wherein the output (76) of the inverter (62) is connected via a diode (152) to the input of the driver component (142).

14. The monitoring circuit of claim 11, wherein the transistors (24, 132) are optotransistors.

15. A monitoring circuit for at least one supply voltage (UB), including a first threshold switch (20), which if the supply voltage (UB) drops below a predeterminable threshold values generates a first warning signal (USWN); a second threshold switch (66) which after a fixed warning time tw generates a second warning signal (TOTUSN); each of the threshold switches (20, 66) have an internal counting circuit for determining time periods tv1, tv2, after which the first and second warning signals (USWN, TOTUSN) generates are reset; the first threshold switch (20) is followed by a capacitor (40) which is discharged as a reaction to the first warning signal (USWN) and is recharged as a reaction to the second warning signal (TOTUSN); the capacitor (40) is connected by its positive terminal, via resistor (38) and a transistor (36), to a positive pole of the supply voltage, and by its negative terminal to a negative pole of the supply voltage; and the capacitor (40) is connected by its positive terminal to the input (68) of the threshold switch (66).

16. A monitoring circuit for at least one voltage, including a first threshold switch (20), which if the voltage drops below a predeterminable threshold value, generates a first warning signal (USWN); a second threshold switch (66) which after a fixed warning time tw generates a second warning signal (TOTUSN); the threshold switches (20, 66) each have an internal counting circuit for determining time periods tv1, tv2, after which the first and second warning signals (USWN, TOTUSN) generates are reset; the first threshold switch (20) is followed by a capacitor (40) which is discharged as a reaction to the first warning signal (USWN) and is recharged as a reaction to the second warning signal (TOTUSN); the capacitor (40) is connected by its positive terminal, via resistor (38) and a transistor (36), to a positive pole of the auxiliary voltage (UH), and by its negative terminal to a negative pole of the auxiliary voltage (UH); and the capacitor (40) is connected by its positive terminal to the input (68) of the threshold switch (66).

* * * * *